United States Patent [19]
Lee et al.

[11] Patent Number: 6,147,924
[45] Date of Patent: Nov. 14, 2000

[54] ARRANGEMENT OF DATA INPUT/OUTPUT CIRCUITS FOR USE IN A SEMICONDUCTOR MEMORY DEVICE

[75] Inventors: Chang-Ho Lee, Kyunggi-do; Jun-Young Jeon, Seoul, both of Rep. of Korea

[73] Assignee: Samsung Electronics Co., Ltd., Kyungki-do, Rep. of Korea

[21] Appl. No.: 09/330,264

[22] Filed: Jun. 11, 1999

[30] Foreign Application Priority Data

Jun. 23, 1998 [KR] Rep. of Korea ............... 98-23610

[51] Int. Cl.[7] ............................................. G11C 8/00
[52] U.S. Cl. .................. 365/230.03; 365/63; 365/233
[58] Field of Search ................. 365/63, 51, 230.03, 365/233, 230.06

[56] References Cited

U.S. PATENT DOCUMENTS

| 5,517,442 | 5/1996 | Kirihata et al. | 365/51 |
| 5,604,710 | 2/1997 | Tomishima et al. | 365/230.03 |
| 5,627,792 | 5/1997 | Tsujimoto | 365/230.03 |
| 5,930,198 | 7/1999 | Ryan | 365/233 |
| 5,995,404 | 11/1999 | Nakaumura et al. | 365/63 |

*Primary Examiner*—Richard Elms
*Assistant Examiner*—Hien Nguyen
*Attorney, Agent, or Firm*—F. Chau & Associates, LLP

[57] ABSTRACT

There is provided a semiconductor memory device which includes a plurality of memory cell blocks arranged in rows and columns. Each memory cell block includes a plurality of memory cells for storing data. A plurality of data input/output circuits are divided into a first group and a second group. The first group and the second group are associated with and disposed between a respective subset of the memory cell blocks. The data input/output circuits have a plurality of data input/output pins. A plurality of address signal circuits are arranged between the first group and the second group for receiving externally applied address signals. The semiconductor memory device is packed using a Non-Outer-DQ-Inner-Control (NON-ODIC) type package having a structure such that the data input/output pins of the data input/output circuits of the first and second groups are collectively arranged adjacent to each other.

18 Claims, 3 Drawing Sheets

ARRANGEMENT OF DATA INPUT/OUTPUT CIRCUITS FOR USE IN A SEMICONDUCTOR MEMORY DEVICE

FIELD OF THE INVENTION

The present invention relates generally to semiconductor memory devices and, in particular, to an arrangement of data input/output circuits having pads and buffers corresponding to a semiconductor memory device of an ultrahigh density.

BACKGROUND OF THE INVENTION

FIG. 1 is a block diagram illustrating the chip layout of a semiconductor memory device according to the prior art. In particular, the chip layout of FIG. 1 is disclosed in U.S. Pat. No. 5,627,792, entitled "LOC Type Semiconductor Memory Device", issued on May 6, 1997, the disclosure of which is incorporated herein by reference.

The semiconductor memory device is formed on a semiconductor chip 1, and includes four memory cell blocks 10T, 10B, 11T and 11B. Each of memory cell blocks 10T, 10B, 11T and 11B includes a plurality of memory cells (not shown). During the normal operation of the semiconductor memory device (e.g., during an external accessing), a one-bit memory cell is selected in each of memory cell blocks 10T, 10B, 11T and 11B, and data is written/read to/from each of memory cell blocks 10T, 10B, 11T and 11B.

Circuits 12, 14 and 16 are arranged in a center region of the semiconductor chip 1 (that is, the region between cell memory blocks 10T and 10B and memory cell blocks 11T and 11B). The circuits 12, 14 and 16 each have a plurality of pads and buffers for inputting and outputting signals. Such a structure in which pads are arranged in the center region of the chip is referred to as a lead on chip (LOC) arrangement. In a LOC arrangement, the tips of a lead frame are arranged on the chip, and the lead frame is connected at the respective tips to the pads arranged in the center region of the chip by wire bonding. Alignment of the pads in the chip center region allows the area occupied by the pads to be reduced in comparison to a structure in which the pads are arranged at a peripheral portion along both sides of semiconductor chip 1. Thus, the former arrangement improves the efficiency of the semiconductor chip 1.

Generally, a semiconductor memory device having a relatively low density is packed using a package which has a pin layout of an ODIC (Outer-DQ-Inner-Control) type, which is used as a JEDEC standard. In the pin layout of the ODIC type package, data input/output pins are arranged outside of both sides of the package, and address and control pins are arranged inside of the data input/output pins. Although the data input/output pins are arranged outside of both sides thereof, skewing between the data input/output pins does not occur because of the small package.

However, as the integrity density increases and access time is shortened, a skew between signals corresponding to the pins having the same function with respect to each other (for example, between data input/output pins) may occur in the case of the ODIC type package. To prevent such a problem, a NON-ODIC (Non-Outer-DQ-Inner-Control) package type may be used. In the case when memory devices are packed using the NON-ODIC type package, pins having the same function are collectively arranged at an adjacent region to minimize the skew between the signals corresponding to those pins.

Typically, to simplify package bonding, the pads formed on the semiconductor chip are arranged with the same layout as the package. In particular, if a semiconductor memory device is packed using a package having the ODIC type pin layout, the pads formed on the semiconductor chip may be aligned by the ODIC type. Similarly, if a semiconductor memory device is packed using a package having the NON-ODIC type pin layout, the pads formed on the semiconductor chip may be arranged in conformance with the NON-ODIC type pin layout.

In the case of a semiconductor memory device having an ultrahigh density (e.g., a device having a 1 giga-bit capacity), the overall speed of the device may decrease when the data input/output, address signal and control signal pads are arranged in accordance with the pad arrangement method described above. In particular, in FIG. 1, when data is written/read to/from the memory cell blocks 10T and 10B and the memory cell blocks 11T and 11B, data line 15 (or data transmission/reception path) between the data input/output circuits 16 and the memory cell blocks 10T and 10B is larger in length than that between the data input/output circuits 16 and the memory cell blocks 11T and 11B. That is, resistance and capacitance of the data line corresponding to the memory cell blocks 10T and 10B are far larger than those of the data line corresponding to the memory cell blocks 11T and 11B. The signal propagation delay in the former case is larger than in the latter case, thus increasing the access time in the former case. In particular, the time period from which data read out from the memory cell blocks 10T and 10B appears at corresponding data input/output pads is delayed on the basis of the time period from which data read out from the memory cell blocks 11T and 11B appears at corresponding data input/output pads.

As a result, since the data out timing of the semiconductor memory device is determined by the delayed data out time period, it is difficult to realize an ultrahigh density memory device which is implemented in accordance with the pin arrangement method set forth above and is capable of performing a high-speed access operation.

SUMMARY OF THE INVENTION

It is therefore an object of the present invention to provide an arrangement of data input/output circuits suitable for a semiconductor memory device having an ultrahigh density.

It is another object of the present invention to provide a semiconductor memory device with an arrangement of data input/output circuits capable of high speed operation.

To attain the above and other objects, according to an aspect of the present invention, there is provided a semiconductor memory device which includes a plurality of memory cell blocks arranged in rows and columns. Each memory cell block includes a plurality of memory cells for storing data. A plurality of data input/output circuits are divided into a first group and a second group. The first group and the second group are associated with and disposed between a respective subset of the memory cell blocks. The data input/output circuits have a plurality of data input/output pins. A plurality of address signal circuits are arranged between the first group and the second group for receiving externally applied address signals. The semiconductor memory device is packed using a Non-Outer-DQ-Inner-Control (NON-ODIC) type package having a structure such that the data input/output pins of the data input/output circuits of the first and second groups are collectively arranged adjacent to each other.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF PREFERRED EMBODIMENTS

Figure 1:
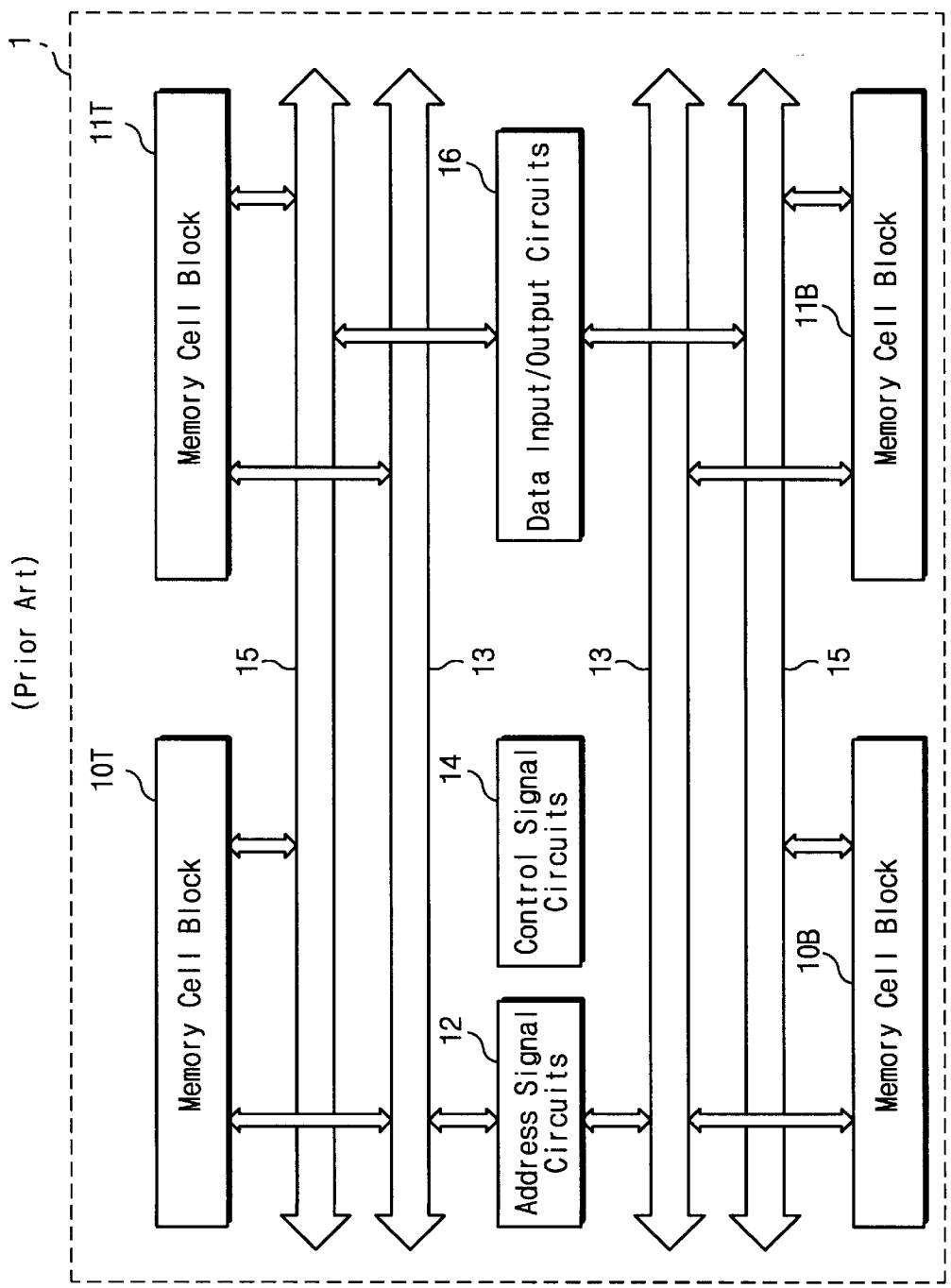
FIG. 1 is a block diagram illustrating the chip layout of a semiconductor memory device according to the prior art.
Figure 2:
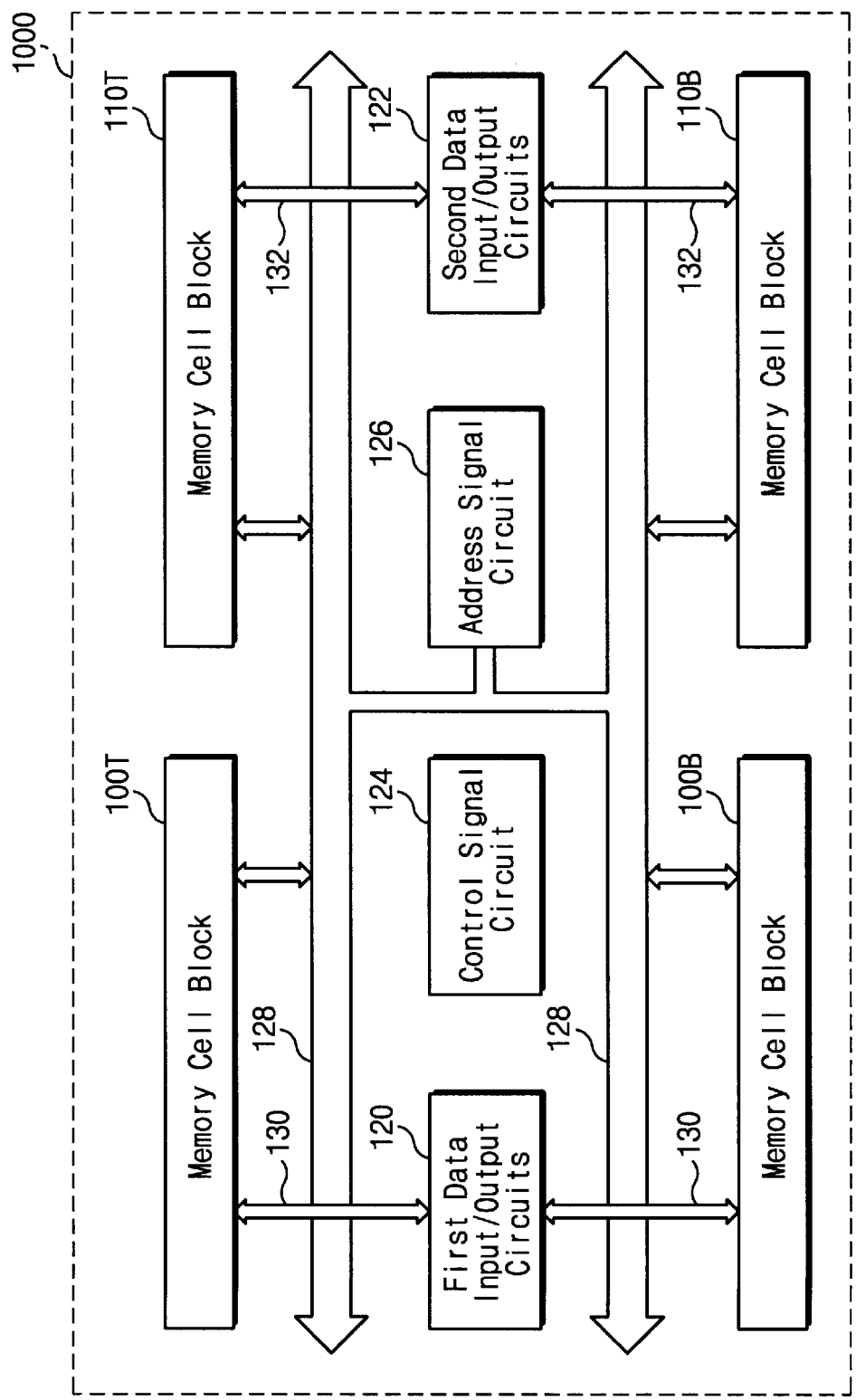
FIG. 2 is a block diagram illustrating the chip layout of a semiconductor memory device according to the present invention.

FIG. 2 is a block diagram illustrating the chip layout of a semiconductor memory device 1000 according to the present invention. The semiconductor memory device 1000 comprises four memory cell blocks 100T, 100B, 110T and 110B arranged in a matrix form. Each of the memory cell blocks 100T, 100B, 110T and 100B comprise a plurality of memory cells for storing 1-bit data information. A first group of data input/output circuits 120 having pads and buffers are arranged at the center region of the left side of the semiconductor memory device, between the memory cell blocks 100T and 100B. A second group of data input/output circuits 122 are arranged at the center region of the right side of the semiconductor memory device, between the memory cell blocks 110T and 110B. The first group of data input/output circuits 120 correspond to the memory cell blocks 100T and 100B, and the second group of data input/output circuits 122 correspond to the memory cell blocks 110T and 110B. Although not shown, the data input/output circuits 120 and 122 comprise a data input/output pad and a data input/output buffer provided proximate to each other.

Between the first group of data input/output circuits 120 and the second group of data input/output circuits 122, control signal circuits 124 and address signal circuits 126 having respective pads and buffers arranged as illustrated in FIG. 2. The semiconductor chip 1000 with such a pad layout as set forth above is packed using only a NON-ODIC (Non-Outer-DQ-Inner-Control) type package with a pin structure such that data input/output pins are collectively arranged at a side of the package. According to the arrangement of the data input/output circuits, when the semiconductor memory device is fabricated so as to have an ultra-high density corresponding to, for example, a one giga-bit capacity, skewing between the signals of the data input/output pads can be minimized so that the semiconductor memory device can perform a high-speed access operation.

Data buses 130 for data transmission/reception are arranged to couple the first group of data input/output circuits 120 to the corresponding memory cell blocks 100T and 100B. Data buses 132 for data transmission/reception are arranged to couple the second group of data input/output circuits 122 to the corresponding memory cell blocks 110T and 110B.

The address signal circuits 126 for receiving external address signals are arranged between the memory cell blocks 110T and 110B and proximate to the second group of data input/output circuits 122. The address signals are transferred to the memory cell blocks 100T, 100B, 110T and 110B through a common address bus 128. Although not shown in FIG. 2, the address signal circuits 126 comprise an address signal pad and an address signal buffer provided proximate to each other. Control signal circuits 124 for receiving control signals (for example, external clock signals, external signals associated with a read/write operation) are arranged adjacent to the first group of data input/output circuits 120 between the memory cell blocks 100T and 100B. Although not shown in FIG. 2, the control circuits 124 comprise a control signal pad and a control signal buffer arranged adjacent to each other.

Figure 3:
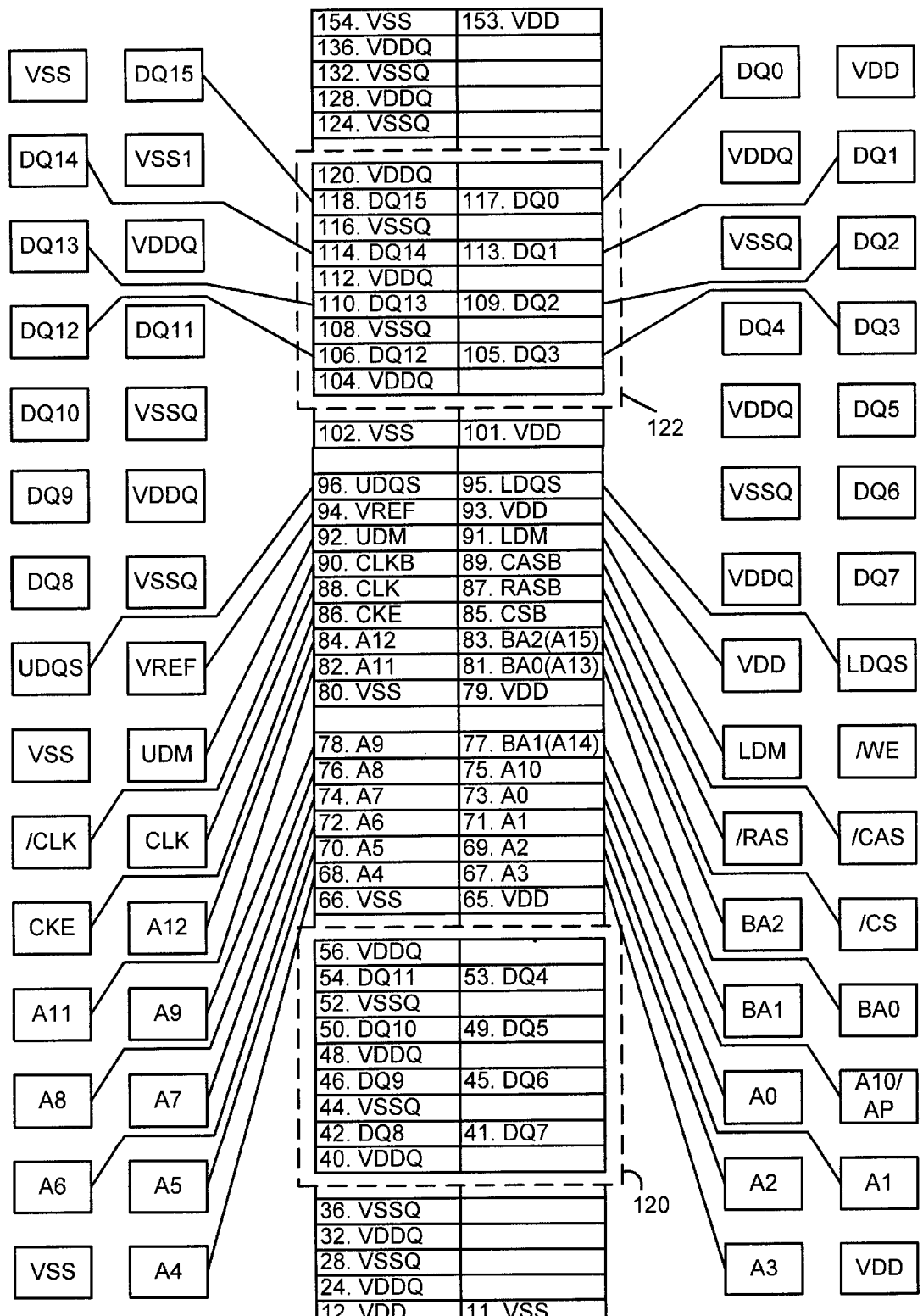
FIG. 3 is a diagram illustrating a package with a NON-ODIC type pin layout.

FIG. 3 is a diagram illustrating the relationship between data input/output pins of a package and data input/output pads of a semiconductor chip. Address signal and control signal pads at the center region of the package are arranged between the first group of data input/output pads 120 and the second group of data input/output pads 122. That is, the data input/output, address signal and control signal pads are positioned in accordance with the ODIC type. Data input/output pins DQi at both sides of the package are collectively arranged adjacent to each other. That is, the data input/output pins are positioned in accordance with the NON-ODIC type. When the pins of the package are bonded to corresponding pads using wires, the wires may intersect each other, thereby short-circuiting the intersected wires. In order to avoid such a problem, the wires may be bonded by use of a multi layer structure (not shown). While the length of the wires thus intersected is longer in comparison to the prior art, the corresponding increase in the resistance and capacitance of the wires (due to the increased length) may be ignored because it is far less than those of the semiconductor chip.

It is to be appreciated that the package used for a semiconductor memory device according to the present invention may be a NON-ODIC type ball grip array package.

By the arrangement of the data input/output circuits according to the present invention, when data is read out from the memory cell blocks 100T and 100B or from the memory cell blocks 110T and 110B, the data transmission/reception path (or data lines) 130 between data input/output circuits 120 of the first group and the memory cell blocks 100T and 100B is similar or equal in length to that between the data input/output circuits 122 of the second group and the memory cell blocks 110T and 110B. In the case that the semiconductor memory device has a density corresponding to, for example, a one giga-bit capacity, no skewing between the signals of the data input/output pads of the first group 120 is caused. Similarly, no skewing between the signals of the data input/output pads of the second group 122 is caused. Furthermore, since the semiconductor memory device having the ultrahigh density is packed using any type of package having the NON-ODIC type pin layout, no skewing between the signals of data input/output pins of the package occurs. As a result, it is possible to realize a semiconductor memory device which has an ultrahigh density, and is capable of performing a high-speed data access operation.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor memory device formed on a chip, comprising:

a plurality of memory cell blocks arranged in rows and columns, wherein each memory cell block comprises a plurality of memory cells for storing data;

a plurality of data input/output circuits divided into a first group and a second group, wherein the first group and the second group are associated with and disposed between a respective subset of the memory cell blocks, and the data input/output circuits have a plurality of data input/output pins; and a plurality of address signal circuits arranged between the first group and the second group, for receiving externally applied address signals, wherein the semiconductor memory device is packed using a Non-Outer-DQ-Inner-Control (NON-ODIC) type package having a structure such that the data input/output pins of the data input/output circuits of the first and second groups are collectively arranged adjacent to each other.

2. The semiconductor memory device according to claim 1, wherein the data input/output circuits comprise a data input/output pad and a data input/output buffer.

3. The semiconductor memory device according to claim 1, wherein the package comprises a NON-ODIC type ball grip array package.

4. The semiconductor memory device according to claim 1, wherein the address signal circuits comprise an address signal pad and an address signal buffer.

5. The semiconductor memory device according to claim 1, further comprising a plurality of control signal circuits arranged adjacent to the data input/output circuits of the first group and between the subset of memory cell blocks corresponding to the first group.

6. The semiconductor memory device according to claim 5, wherein the control signal circuits comprise a control signal pad and a control signal buffer.

7. The semiconductor memory device according to claim 5, wherein the data input/output circuits comprise a data input/output pad and a data input/output buffer, the address signal circuits comprise an address signal pad and an address signal buffer, the control signal circuits comprise a control signal pad and a control signal buffer, and the semiconductor memory device further comprises a plurality of wires for electrically connecting the data input/output, address signal, and control signal pads to corresponding pins of the package, the wires being arranged in a multi layer structure.

8. A semiconductor memory device formed on a chip comprising:

a plurality of memory cell blocks arranged in rows and columns, wherein each memory cell block comprises a plurality of memory cells for storing data;

a plurality of data input/output circuits divided into a first group and a second group, wherein the first group and the second group are associated with and disposed between a respective subset of the memory cell blocks, and the data input/output circuits have a data input/output pad, a data input/output buffer, and a plurality of data input/output pins;

a plurality of address signal circuits arranged between the first group and the second group, for receiving externally applied address signals, wherein the address signal circuits have an address signal pad and an address signal buffer; and a plurality of control signal circuits arranged adjacent to the data input/output circuits of the first group and between the subset of memory cell blocks corresponding to the first group of data input/output circuits, wherein the control signal circuits have a control signal pad and a control signal buffer, and the semiconductor memory device is packed using a Non-Outer-DQ-Inner-Control (NON-ODIC) type package having a structure such that the data input/output pins of the data input/output circuits of the first group and the second group are collectively arranged adjacent to each other.

9. The semiconductor memory device according to claim 8, wherein a plurality of wires for electrically connecting the data input/output, address signal and control signal pads to corresponding pins of the package are arranged in a multi layer structure.

10. A semiconductor memory device formed on a chip, comprising:

a set of memory cell blocks arranged in rows and columns, wherein each memory cell block comprises a plurality of memory cells for storing data; and a plurality of data input/output circuits divided into a plurality of groups, wherein each group is associated with and disposed proximate to a corresponding subset of memory cell blocks, and includes a plurality of data input/output pins, the semiconductor memory device being packed using a Non-Outer-DQ-Inner-Control (NON-ODIC) type package having a structure such that the data input/output pins of the plurality of groups are collectively arranged adjacent to each other.

11. The semiconductor memory device according to claim 10, further comprising a plurality of address signal circuits for receiving address signals.

12. The semiconductor memory device according to claim 11, wherein the address signal circuits are arranged between the groups of data input/output circuits.

13. The semiconductor memory device according to claim 10, wherein the data input/output circuits comprise a data input/output pad and a data input/output buffer.

14. The semiconductor memory device according to claim 10, wherein the package comprises a NON-ODIC type ball grip array package.

15. The semiconductor memory device according to claim 11, wherein the address signal circuits comprise an address signal pad and an address signal buffer.

16. The semiconductor memory device according to claim 11, further comprising a plurality of control signal circuits, each control signal circuit arranged adjacent to an associated group of data input/output circuits and between the memory cell blocks of the subset of memory cell blocks corresponding to the associated group of data input/output circuits.

17. The semiconductor memory device according to claim 16, wherein the control signal circuits comprise a control signal pad and a control signal buffer.

18. The semiconductor memory device according to claim 16, wherein the data input/output circuits comprise a data input/output pad and a data input/output buffer, the address signal circuits comprise an address signal pad and an address signal buffer, the control signal circuits comprise a control signal pad and a control signal buffer, and the semiconductor memory device further comprises a plurality of wires for electrically connecting the data input/output, address signal, and control signal pads to corresponding pins of the package, the wires being arranged in a multi layer structure.

* * * * *